(12) United States Patent
Pham et al.

(10) Patent No.: US 11,262,809 B2
(45) Date of Patent: Mar. 1, 2022

(54) BASE CHASSIS INCLUDING EXTENSION TO SUPPORT ADDITIONAL STORAGE CAGE

(71) Applicant: HEWLETT PACKARD ENTERPRISE DEVELOPMENT LP, Houston, TX (US)

(72) Inventors: Kenny H. Pham, Houston, TX (US); Earl W. Moore, Cypress, TX (US); Paul E. Westphall, Tomball, TX (US); Daniel W. Tower, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 80 days.

(21) Appl. No.: 16/408,884

(22) Filed: May 10, 2019

(65) Prior Publication Data

US 2020/0356147 A1 Nov. 12, 2020

(51) Int. Cl.
*G06F 1/18* (2006.01)
(52) U.S. Cl.
CPC .................................. *G06F 1/181* (2013.01)
(58) Field of Classification Search
CPC ..... G11B 33/128; G11B 33/124; G06F 1/181; G06F 1/187; G06F 1/183; H05K 7/1488; H05K 7/1487
USPC ....... 361/679.33, 679.37, 679.39; 312/223.1, 312/223.2
See application file for complete search history.

(56) References Cited

U.S. PATENT DOCUMENTS

| | | | | |
|---|---|---|---|---|
| 5,566,049 A | * | 10/1996 | Nguyen | G11B 33/08 248/221.11 |
| 5,980,003 A | * | 11/1999 | Huang | G11B 33/124 312/223.2 |
| 6,317,317 B1 | * | 11/2001 | Lu | G06F 1/184 248/611 |
| 6,611,424 B2 | | 8/2003 | Huang | |
| 7,401,756 B2 | | 7/2008 | Lien et al. | |
| 7,679,900 B2 | | 3/2010 | Lee et al. | |
| 8,711,557 B2 | | 4/2014 | Sun | |
| 9,781,857 B2 | | 10/2017 | Jau et al. | |
| 2002/0181197 A1 | * | 12/2002 | Huang | G11B 33/128 361/679.39 |
| 2004/0173544 A1 | * | 9/2004 | Chen | G11B 33/128 211/26 |
| 2005/0185370 A1 | * | 8/2005 | Chung | G06F 1/181 361/679.56 |
| 2006/0146490 A1 | * | 7/2006 | Chen | G06F 1/181 361/679.02 |
| 2008/0298008 A1 | * | 12/2008 | Fan | G11B 33/128 361/679.32 |
| 2010/0002369 A1 | * | 1/2010 | Lee | G06F 1/187 361/679.33 |

(Continued)

*Primary Examiner* — Hiwot E Tefera
(74) *Attorney, Agent, or Firm* — Nolte Lackenbach Siegel (57) ABSTRACT

A base chassis supports a set of storage cages. The base chassis includes a front portion that is removably attachable to a first storage cage. The base chassis also includes an extension portion. The extension portion has a first end that is fixedly attachable to the front portion to extend a length of the base chassis to support an additional storage cage when the first storage cage is detached from the front portion. The extension portion also has a second end that is attachable to the first storage cage to support the first storage cage.

16 Claims, 7 Drawing Sheets

(56) References Cited

U.S. PATENT DOCUMENTS

| | | | | |
|---|---|---|---|---|
| 2010/0026149 A1* | 2/2010 | Zhang | ................... | G06F 1/181 |
| | | | | 312/223.2 |
| 2010/0078948 A1* | 4/2010 | Wu | ................... | H05K 7/20727 |
| | | | | 292/336.3 |
| 2012/0292266 A1* | 11/2012 | Smith | ................. | H02G 3/0608 |
| | | | | 211/13.1 |
| 2013/0258620 A1* | 10/2013 | Qiu | ................... | G11B 33/128 |
| | | | | 361/759 |
| 2014/0153181 A1* | 6/2014 | Peng | ................... | H05K 7/1489 |
| | | | | 361/679.39 |
| 2014/0285977 A1* | 9/2014 | Li | ....................... | G11B 33/128 |
| | | | | 361/747 |
| 2015/0022069 A1* | 1/2015 | Lv | ......................... | G06F 1/187 |
| | | | | 312/309 |
| 2015/0136722 A1* | 5/2015 | Chen | ................... | H05K 7/1489 |
| | | | | 211/175 |
| 2015/0201522 A1* | 7/2015 | Jau | ...................... | H05K 7/1488 |
| | | | | 312/330.1 |
| 2015/0282373 A1* | 10/2015 | AbuGhazaleh | ...... | H05K 7/1488 |
| | | | | 312/273 |
| 2016/0161997 A1* | 6/2016 | Peng | ....................... | G06F 1/181 |
| | | | | 361/679.31 |
| 2016/0270250 A1* | 9/2016 | Chen | ................... | G11B 33/128 |
| 2019/0069440 A1* | 2/2019 | Adrian | ................ | H05K 7/20563 |

\* cited by examiner

BASE CHASSIS INCLUDING EXTENSION TO SUPPORT ADDITIONAL STORAGE CAGE

BACKGROUND

Computing system, such as server assemblies, include storage disks. The storage disks are enclosed in casings. Storage cages are supported by a base chassis. The base chassis with the storage disks enclosed in the storage cages is inserted into a rack to form the computing system.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related, and business-related constraints, which will vary from one implementation to another. Moreover, it will be appreciated that such a development effort, even if complex and time-consuming, would be a routine undertaking for those of ordinary skill in the art having the benefit of this disclosure.

A base chassis in a computing system, such as a server assembly, has a standard length. A base chassis can refer to a metal structure that supports storage cages that enclose storage disks contained within carriers. The base chassis is inserted into a rack within the computing system. As used herein, a "computing system" may be a storage array, storage device, storage enclosure, server, computer cluster, or any other device or equipment including a controller, a processing resource, or the like. In examples described herein, a "processing resource" may include, for example, one processor or multiple processors included in a single computing system or distributed across multiple computing systems. As used herein, a "processor" may be at least one of a central processing unit (CPU), a semiconductor-based microprocessor, a graphics processing unit (GPU), a field-programmable gate array (FPGA) to retrieve and execute instructions, other electronic circuitry suitable for the retrieval and execution instructions stored on a machine-readable storage medium, or a combination thereof.

Storage disks, as referred to herein, can include a storage medium such as a hard disk drive (HOD), a solid-state drive (SSD), or any other type of storage medium that may be enclosed in a storage cage. As used herein, a "storage medium" may be any electronic, magnetic, optical, or other physical storage apparatus to contain or store information such as executable instructions, data, and the like. For example, any storage medium described herein may be any of Random Access Memory (RAM), volatile memory, non-volatile memory, flash memory, a storage drive (e.g., a hard drive), a solid state drive, any type of storage disc (e.g., a compact disc, a DVD, etc.), and the like, or a combination thereof. Any storage medium described herein may be non-transitory.

A storage cage can refer to a small form factor (SFF) cage, a large form factor (LFF) cage, or any another enclosure that encloses one or more storage disks contained within one or more carriers, allowing connection of the storage disks to other parts of the computing system.

Typically, the length of a base chassis is fixed, such that only a limited number of storage cages can be supported by the base chassis. The fixed length of the base chassis depends on the number of storage disks the computing system is designed to accommodate. As the length of the base chassis is fixed, different base chassis must be used to support different numbers of storage disks According to illustrative examples, an extension portion is provided for a base chassis. The extension portion may be fixedly attached to an existing base chassis to extend the length of the base chassis to support an additional storage cage.

According to illustrative examples, providing an extension portion allows a common base chassis to be used to support different numbers of storage cages. This provides for efficiency and flexibility in manufacturing and also reduces costs, as the same base chassis may be used for different computing systems designed to accommodate different numbers of storage cages.

Figure 1:
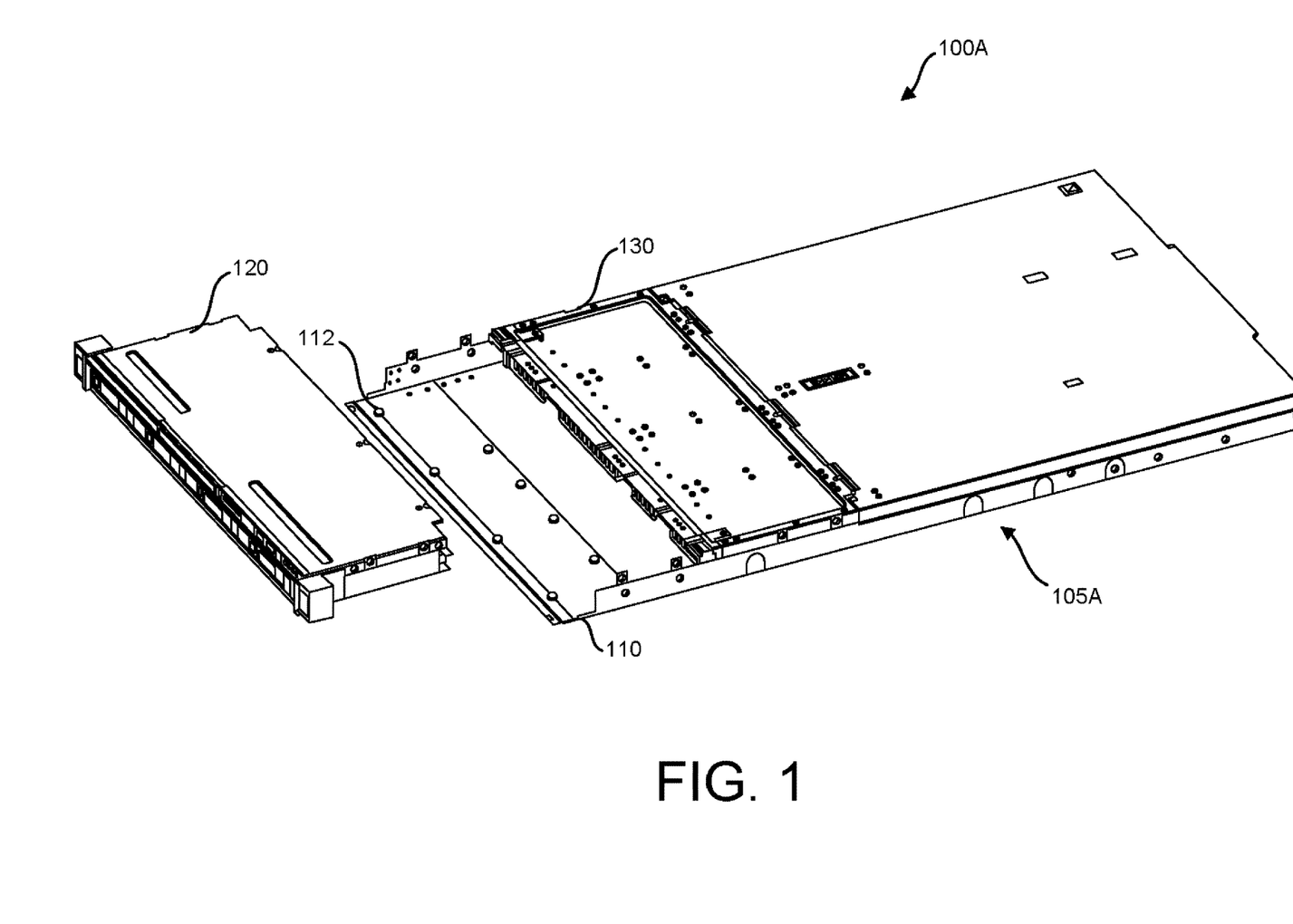
FIG. 1 is a perspective view of a device including a base chassis with a front portion, according to one or more examples of the present disclosure.

FIG. 1 is a perspective view of a device 100A including a base chassis 105A without an extension portion. As shown in FIG. 1, the base chassis 105A is designed to support a set of storage cages including a first storage cage 120 and a second storage cage 130.

As an example, the base chassis 105A may be a 1075 mm chassis designed to accommodate the first storage cage 120 and the second storage cage 130, and each of the first storage cage 120 and the second storage cage 130 may be designed to enclose eight storage disks contained within carriers.

The base chassis 105A includes a front portion 110 to which the first storage cage 120 is removably attachable. The front portion includes spools 112 over which apertures (not shown) defined by the first storage cage 120 fit to removably attach the first storage cage 120 to the front portion 110. In addition, or as an alternative, the first storage cage 120 may be removably attachable to the front portion 110 via any other suitable attachment mechanism.

In FIG. 1, the first storage cage 120 is shown as being detached from the front portion 110. The first storage cage 120 may be attached to the front portion 110 by sliding the front storage cage 120 toward the front portion 110 in line with the spools 112 and then downward such that the apertures defined by the first storage cage fit over the spools 112. The first storage cage 120 may be detached from the front portion 110 by sliding the first storage cage 120 up from the front portion 110 to release the apertures defined by the first storage cage 120 from the spools 112 on the front portion 110. Then, the first storage cage 120 may be slid away from the front portion 110 to detach the first storage cage 120 from the front portion 110.

Figure 2:
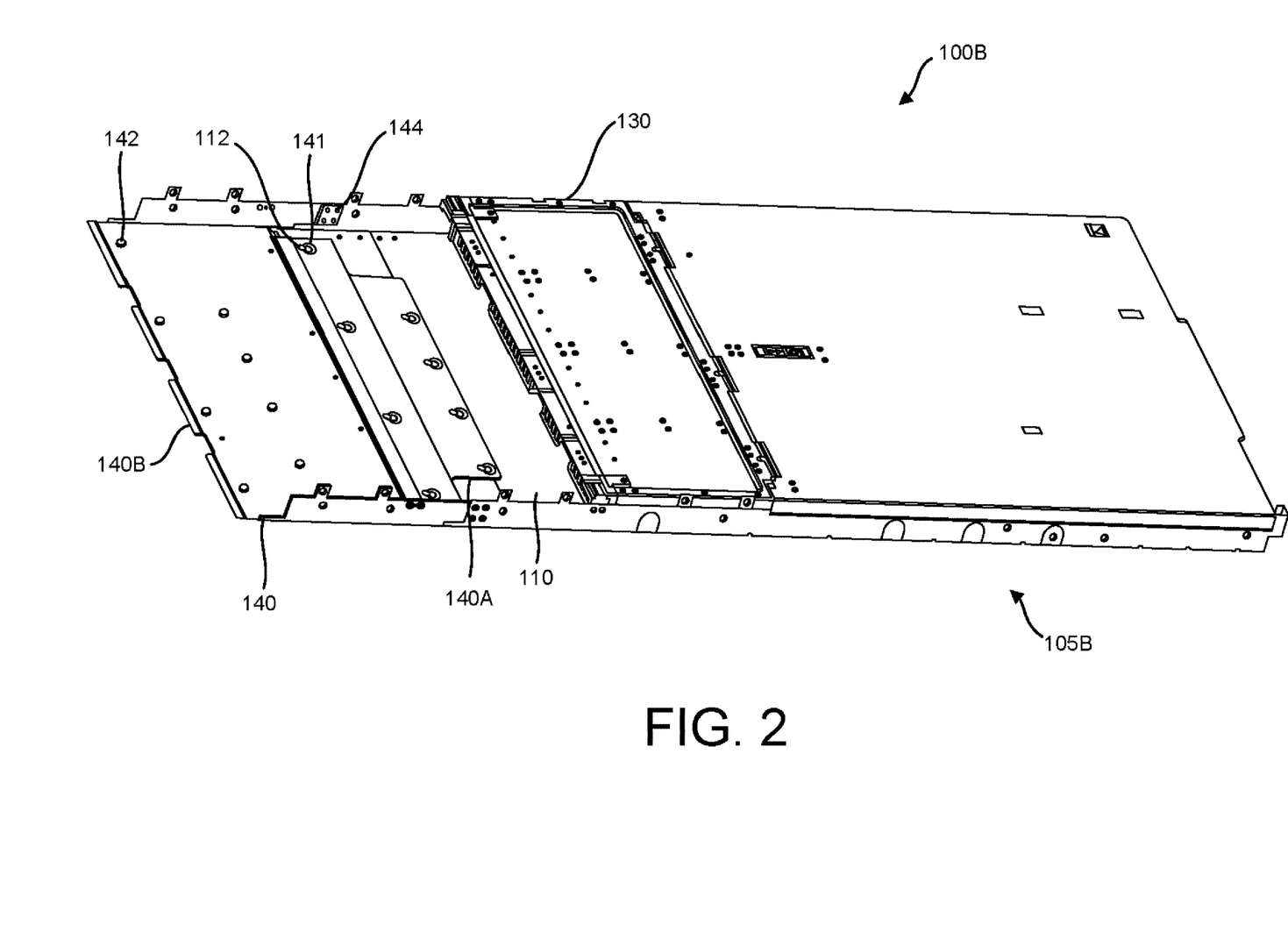
FIG. 2 is a perspective view of a device including a base chassis having a front portion and an extension portion, according to one or more examples of the present disclosure.

FIG. 2 is a perspective view of a device 100B including a base chassis 105B having a front portion 110 and an extension portion 140, according to one or more examples of the present disclosure. The base chassis 105B is designed to support the first storage cage 120 and the second storage cage 130, along with an additional storage cage (shown in FIG. 3). For this purpose, the extension portion 140 includes a first end 140A that is fixedly attachable to the front portion 110 of the base chassis 105B when the first storage cage 120 is detached from the front portion 110 to support the additional storage cage.

The base chassis 105B includes spools 112 on the front portion 110 over which apertures 141 defined by the first end 140A of the extension portion 140 fit to fixedly attach the extension portion 140 to the front portion 110. In one example, the spools 112 may be the same spools used to attach the first storage cage 120. Additionally, the apertures 141 may be in the same locations, relative to the spools 112, as the apertures defined by the first storage cage 120.

The first end 140A of the extension portion 140 may be fixedly attached to the front portion 110 by sliding the extension portion 140 toward the front portion 110 in line with the spools 112. Then, the first end 140A of the extension portion may be moved downward, such that the apertures 141 defined by the extension portion 140 fit over the spools.

Additionally, one or more securing devices 144 may be used to securely attach the extension portion 140 to the front portion 110. The securing devices 144 may include screws, bolts, rivets, and/or any other physical securing devices. In addition, or as an alternative, the first extension portion 140 may be fixedly attached to the front portion 110 via any other suitable attachment mechanism.

The extension portion 140 also includes a second end 140B that is attachable to the first storage cage 120 to support the first storage cage 120. The second end 140B includes spools 142 over which apertures defined by the first storage cage 120 fit to attach the first storage cage 120 to the extension portion 140. The spools 142 may be in the same location, relative to the apertures defined by the first storage cage 120, as the spools 112.

The first storage cage 120 may be attached to the second end 140B of the extension portion 140 by sliding the front storage cage 120 toward the second end 140B in line with the spools 142. Then, the first storage cage 120 may be moved downward such that the apertures defined by the first storage disk 120 casing fit over the spools 142.

Figure 3:
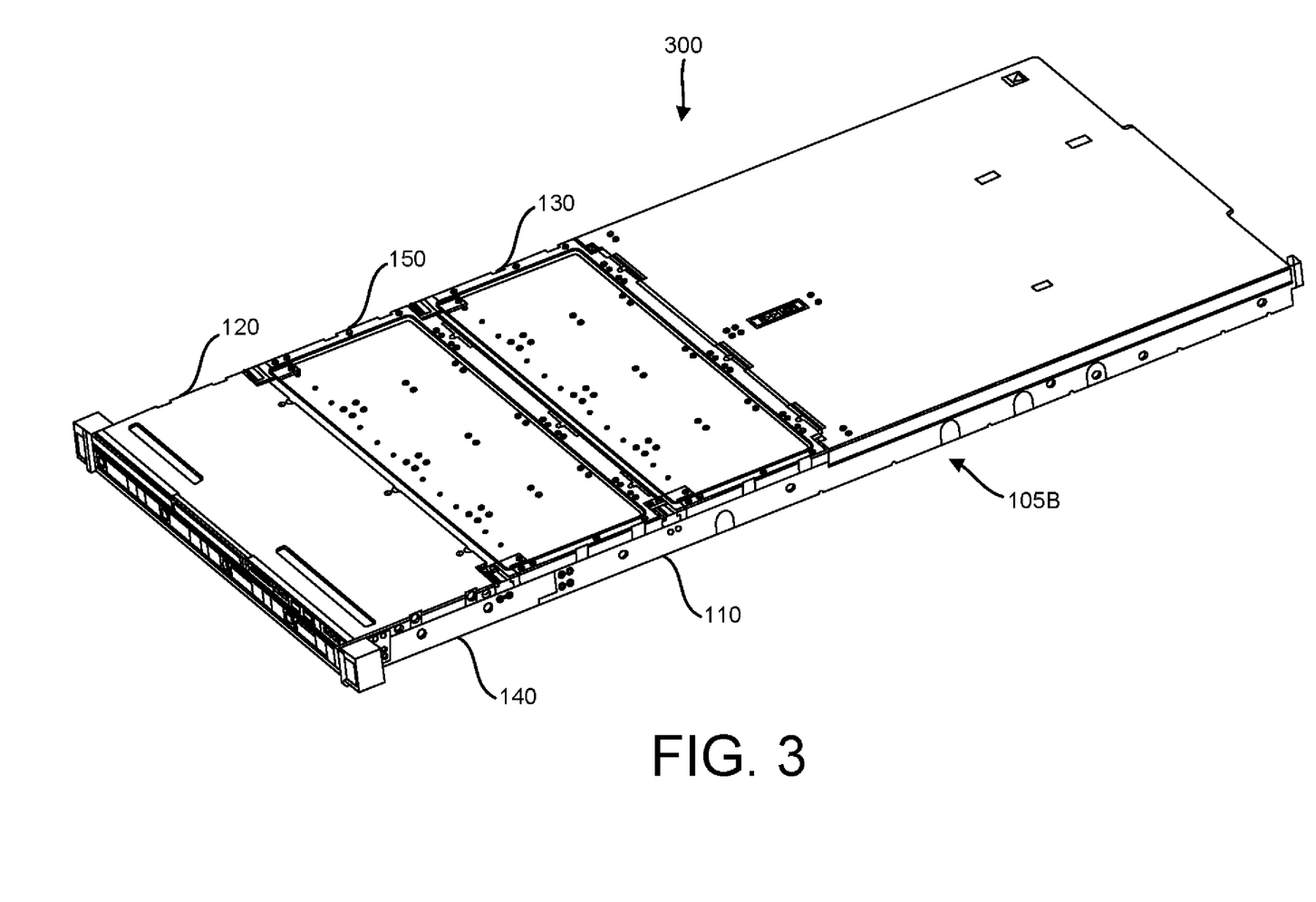
FIG. 3 is a perspective view of a system including a base chassis supporting a set of storage cages, according to one or more examples of the present disclosure.

FIG. 3 is a perspective view of a system 300 including a base chassis 105B supporting a set of storage cages, according to one or more examples of the present disclosure. As shown in FIG. 3, the system 300 includes the base chassis 105B with the extension portion 140 attached to the front portion 110. When fixedly attached to the front portion 110, the extension portion 140 becomes a structural part of the base chassis 105B.

As can be seen from FIG. 3, the extension portion 140 allows the base chassis 105A shown in FIG. 1 to be converted to the longer base chassis 105B shown in FIG. 2. That is, the extension portion 140 extends the length of the base chassis 105A. With the extension portion 140 attached, the base chassis 105B is able to support the first storage cage 120, the second storage cage 130, and an additional storage cage 150.

As an example, the base chassis 105B may be a 1200 mm chassis designed to accommodate the first storage cage 120, the second storage cage 130, and the additional storage cage 150. Each of the first storage cage 120, the second storage cage 130, and the additional storage cage 150 may be designed to enclose eight storage disks contained within carriers. In this example, compared to the base chassis 105A shown in FIG. 1, the base chassis 105B shown in FIGS. 2 and 3 is able to accommodate eight additional storage disks.

It should be appreciated that the number of storage cages and the number of storage disks contained within carriers in each storage cage described above are provided by way of example, and the base chassis 105A, 105B may be designed to support other numbers of storage cages enclosing other numbers of storage disks contained within carriers. For example, the base chassis 105A shown in FIG. 1 may be designed to support only one storage cage, and the base chassis 105B shown in FIGS. 2 and 3 may be designed to support more than one additional storage cage 150.

Figure 4:
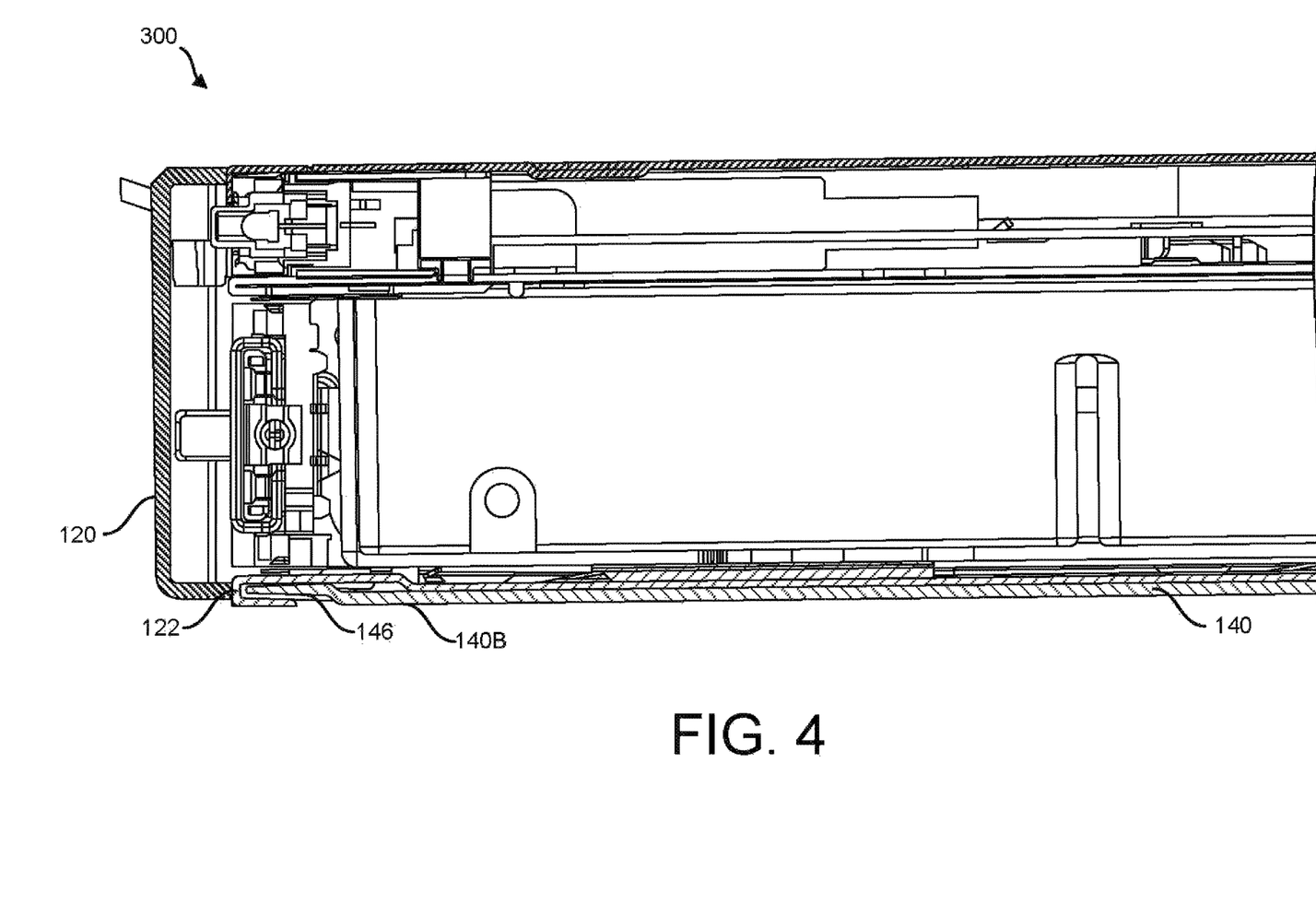
FIG. 4 is a cross-sectional view of a portion of system illustrating attachment of an extension portion to a first storage cage, according to one or more examples of the present disclosure.

FIG. 4 is a cross-sectional view of a portion of the system 300 illustrating attachment of an extension portion 140 to a first storage cage 120, according to one or more examples of the present disclosure. As shown in FIG. 4, the second end 140B of the extension portion 140 includes a raised portion 146. The raised portion 146 fits within a U-shaped portion 122 on the first storage cage 120. This allows the first storage cage 120 to wrap around and hook onto the second end 140B of the extension portion when the first storage cage 120 is attached to the second end 140B. This helps secure attachment of the first storage cage 120 to the extension portion 140 and provides structural support.

Although not shown, it should be appreciated that the front portion 110 of the base chassis 105B shown in FIGS. 2 and 3 may also include a raised portion similar to the raised portion 146. The raised portion on the front portion may fit within the U-shaped portion 122 on the first storage cage 120 when the first storage cage 120 is attached to the front portion 110.

Further, although not shown, it should be appreciated that the first storage cage 120, the second storage cage 130, and the additional storage cage 150 may be connected to a computing system into which the base chassis 105A and/or the base chassis 105B is inserted by cables. Depending on the size of the storage disk being used, the cables can be routed underneath the storage cages and/or on the side of the base chassis 105A and/or the base chassis 105B to a connection point in the computing system.

Figure 5:
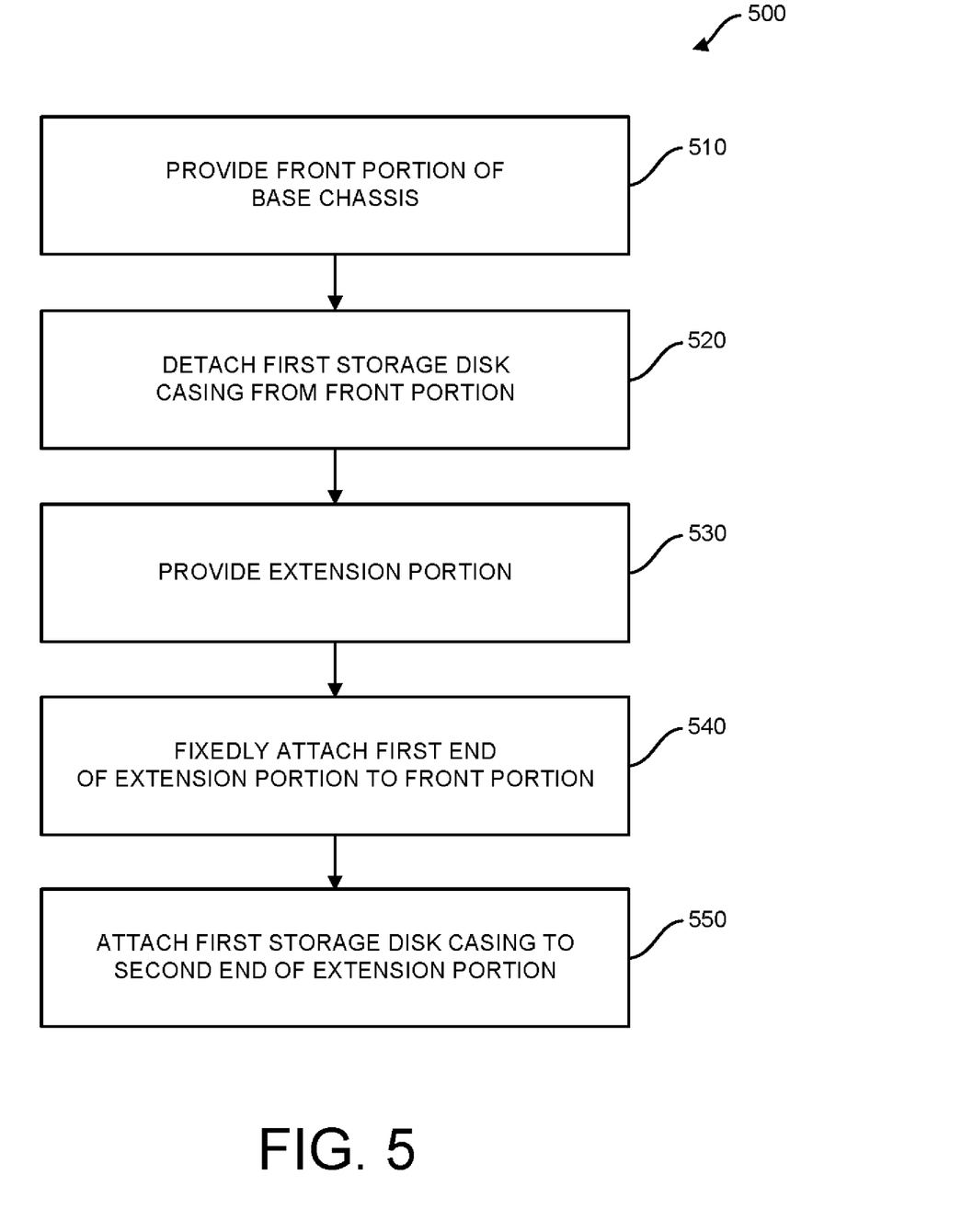
FIG. 5 is a flowchart depicting a method for providing a base chassis with an extension portion to support storage cages, according to one or more examples of the present disclosure.

FIG. 5 is a flowchart depicting a method 500 for providing a base chassis with an extension portion to support storage cages, according to one or more examples of the present disclosure. The method may be used to provide the base chassis 105B, including the extension portion 140 fixedly attached to the front portion 110, with the first disk cage 120 attached to the extension portion as shown in FIGS. 2 and 3.

Referring to FIG. 5, a front portion of a base chassis is provided at 510 to support at least a first storage cage that is removably attached to the front portion. The first storage cage is detached from the front portion of the base chassis at 520. The first storage cage may be detached from the front portion of the base chassis by sliding the first storage cage up to release apertures defined by the first storage cage from spools included on the front portion and then moving the first storage cage away from the front portion.

At 530, an extension portion of the base chassis is provided. The extension portion includes a first end and a second end.

At 540, the first end of the extension portion is fixedly attached to the front portion to extend a length of the base chassis to support an additional storage cage. The first end of the extension portion may be fixedly attached to the front portion by sliding the extension portion toward the front portion in line with spools included on the front portion and then moving the first end of the extension portion downward over the spools, such that apertures defined by the first end of the extension portion fit over the spools.

At 550, the first storage cage is attached to the second end of the extension portion to support the first storage cage. The first storage cage may be attached to the second end of the extension portion by sliding the front storage cage toward the second end in line with spools included on the second end and then moving the first storage cage downward such that apertures defined by the front disk storage casing fit over the spools.

In the example method 500 described above, a base chassis that supports a first storage cage is converted into a base chassis for supporting an additional storage cage by adding an extension portion to the base chassis.

Although the example method 500 described above includes detaching the first storage cage from the front portion of the base chassis at 520, it should be appreciated that, according to another example, the extension portion may be attached to the front portion without requiring detachment of a storage cage, For example, the extension portion may be fixedly attached to the front portion during manufacturing, before attachment of the first storage cage.

In the examples described above, an extension portion is fixedly attached to a front portion of a base chassis using spools, screws, and/or other attachment or securing mechanism. According to another example, described below with reference to FIGS. 6-8 a rail kit may be provided including one or more rails. The rail(s) may be attached to one or more sides of the base chassis to further secure attachment of the extension portion to the front portion and to provide support for the base chassis.

Figure 6:
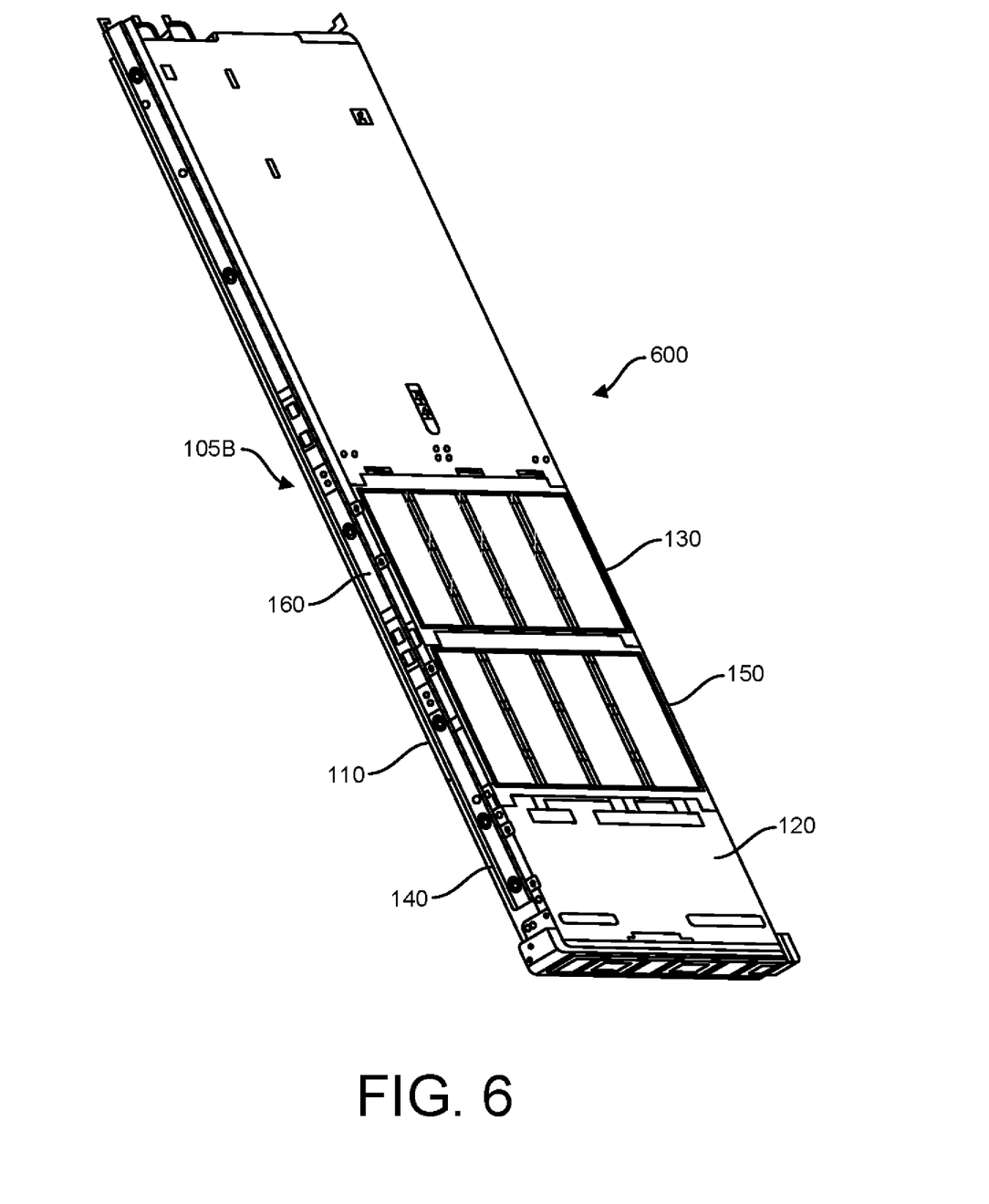
FIG. 6 is a perspective view of a system including a rail attached to a side of a base chassis, according to one or more examples of the present disclosure.

Referring first to FIG. 6, a perspective view is shown of a system 600 including a rail 160 according to one or more examples of the present disclosure. The rail 160 is attached to a side of the base chassis 105B. The rail 160 acts as a guide when the base chassis is being inserted into and removed from a rack of a computing system. Also, the rail provides structural support for the base chassis.

Figure 7:
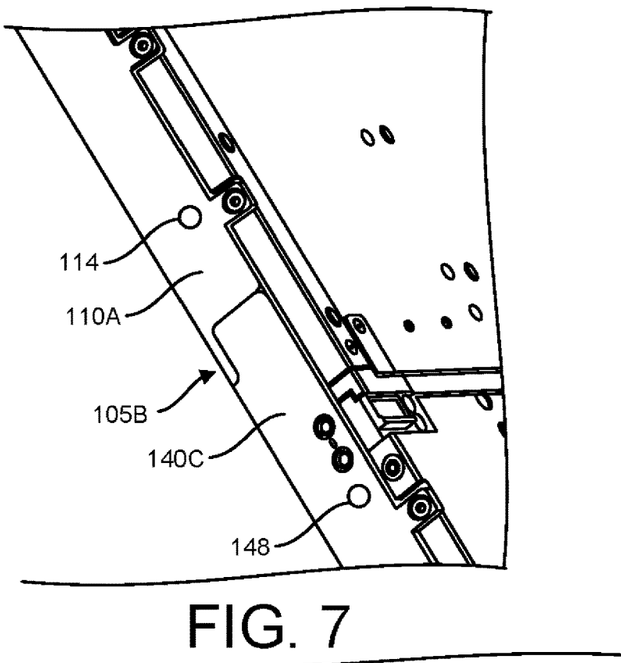
FIG. 7 is a perspective view of a portion of a system including a base chassis without a rail attached, according to one or more examples of the present disclosure.

As shown in FIG. 7, the base chassis 105B includes a front side portion 110A and an extension side portion 140C. The front side portion 110A and the extension side portion 140C define apertures 114 and 148, respectively.

As can be seen from FIG. 7, when the rail 160 is not attached to the front side portion 110A and the extension side portion 140C, there is a small gap between the front side portion 110A and the extension side portion 140C. This gap poses a challenge when the base chassis 105B is being removed from a rack of a computing system.

For example, consider a base chassis 105B that is slid within a rack of a computing system with the front portion 110 facing the rack. When the base chassis is being removed, the end of the base chassis having the extension portion 140 is removed first. As the base chassis 105B slides out of the rack, the front portion 110 creates a counter load. This counter load may cause the extension portion 140 and the front portion 110 to move away from each other as the base chassis 105B is removed from the rack.

According to illustrative examples, attachment of the rail 160 to one or more sides of the bases chassis not only secures attachment of the front portion 110 to the extension portion 140 but also acts as a guide when the base chassis is being inserted or removed from a rack of a computing system. In addition, the rail 160 provides structural support for the base chassis 105B. The rail 160 acts to relieve a counter load on one end of the base chassis 105B when the base chassis 105B is being removed from a rack of a computing system, such that the extension portion 140 remains securely attached to the front portion 110.

Figure 8:
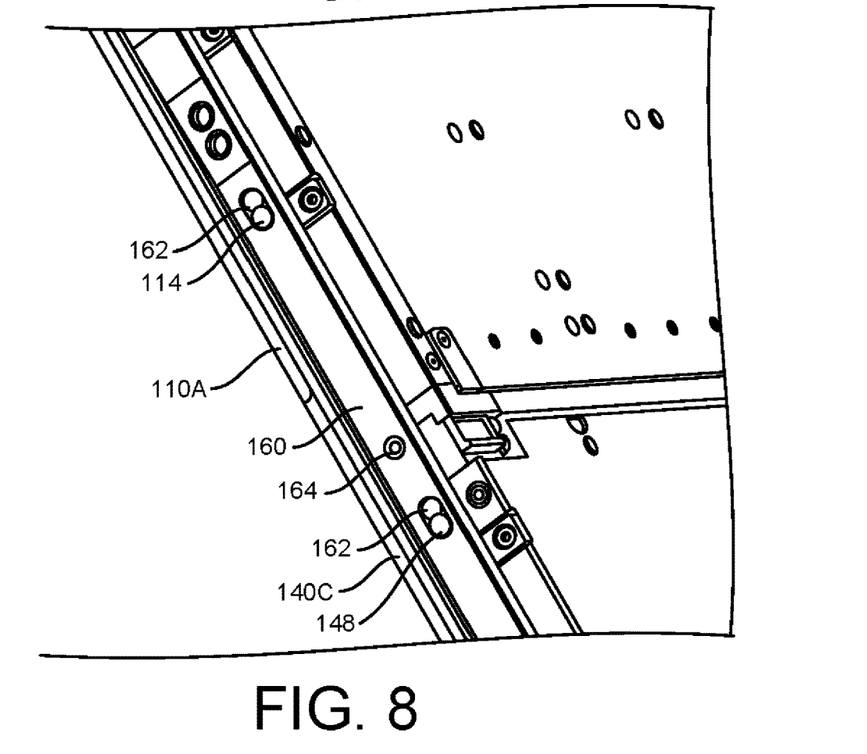
FIG. 8 is a perspective view of a portion of a system including a base chassis with a rail attached, according to one or more examples of the present disclosure.

Referring to FIG. 8, the rail 160 is attachable to the front side portion 110A and the extension side portion 140C. For this purpose, the rail 160 includes spools 162. The spools 162 fit within the apertures 114 and 148 defined by the front side portion 110A and the extension side portion 140C, respectively.

The rail 160 may be attached to the front side portion 110A and the extension side portion 140C by moving the rail 160 toward the front side portion 110A and the extension side portion 140C, such that the rail 160 contacts the surfaces of the front side portion 110A and the extension side portion 140C. Then, the rail 160 may be slid along the surfaces of the front side portion 110A and the extension side portion 140C, such that the spools 162 fit within the apertures 114 and 148 defined by the front side portion 110A and the extension side portion 140C, respectively.

As shown in FIG. 8, the rail 160 may be secured to the side of the base chassis 105B using one ore more securing devices 164. The securing devices 164 may include screws, bolts, rivets, and/or any other physical securing devices. In addition, or as an alternative, the rail 160 may be secured to the side of the base chassis 105B via any other suitable attachment mechanism.

Although only one rail is shown in FIG. 6-8, it should be appreciated that another rail may be attached on an opposite side of the base chassis 105B to provide additional support.

According to illustrative examples, an extension portion may be fixedly attached to a base chassis to extend the length of the base chassis to allow the base chassis to support one or more additional storage cages. This provides for flexibility and efficiency during manufacturing and also reduces costs, as a common base chassis may be used to accommodate different numbers of storage cages.

According to other illustrative examples, one or more rails may be attached to one or more sides of the bases chassis to provide for structural support. This is advantageous when the base chassis being removed from a rack of a computing system.

The foregoing description, for purposes of explanation, used specific nomenclature to provide a thorough understanding of the disclosure. However, it will be apparent to one skilled in the art that the specific details are not required in order to practice the devices, systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A device comprising:
a base chassis to support a set of linearly aligned storage cages, the base chassis including:
   a front portion that is removably attachable to a first storage cage; and
   an extension portion that, when attached to the front portion, increases a length of the base chassis by an amount sufficient to install an additional one of the set of linearly aligned storage cages, the extension portion and the first storage cage being alternatively attachable to the front portion, the extension portion including:
      a first end that is fixedly attachable to the front portion to extend the length of the base chassis to support the additional one storage cage when the first storage cage is detached from the front portion and the additional one storage cage is installed therein; and
      a second end that is attachable to the first storage cage to support the first storage cage such that the first storage cage and the additional one storage cage are both members of the set of linearly aligned storage cages supported by the base chassis;
the base chassis further including a front side portion and an extension side portion to which a rail is attachable to secure attachment of the extension portion to the front portion; and
the front side portion and the extension side portion of the base chassis defining apertures into which spools on the rail fit to fixedly attach the rail to the front side portion and the extension side portion to secure the front portion to the extension portion in a fixed relative position with respect to one another,
wherein the apertures defined within the front side portion and the extension side portion define closed circular shapes.

2. The device of claim 1, wherein the front portion includes spools over which apertures defined by the first storage cage fit to removably attach the first storage cage.

3. The device of claim 1, wherein the front portion includes spools over which apertures defined by the first end of the extension portion fit to fixedly attach the extension portion to the front portion.

4. The device of claim 1, wherein the extension portion is attached to the front portion using a securing device.

5. The device of claim 1, wherein the second end of the extension portion includes spools over which apertures defined by the first storage cage fit to attach the first storage cage.

6. The device of claim 1, wherein the second end of the extension portion includes a raised portion that fits within a U-shaped portion on the first storage cage to secure attachment of the first storage cage.

7. The device of claim 1, wherein the rail is secured to the front side portion and the extension portion using a securing device.

8. A system comprising:
a set of linearly aligned storage cages including a first storage cage and an additional storage cage;
a base chassis to support the set of storage cages, the base chassis including:
   a front portion that is removably attachable to the first storage cage, the front portion supporting the first storage cage when the first storage cage is attached to the front portion;
   a front side portion; and
   an extension portion that, when attached to the front portion, increases a length of the base chassis by an amount sufficient to install an additional one of the set of linearly aligned storage cages, the extension portion and the first storage cage being alternatively attachable to the front portion, the extension portion including:
      a first end that is fixedly attachable to the front portion to extend the length of the base chassis to support the additional one storage cage when the first storage cage is detached from the front portion and the additional one storage cage is installed therein; and
      a second end that is attachable to the first storage cage to support the first storage cage such that the first storage cage and the additional one storage cage are both members of the set of linearly aligned storage cages supported by the base chassis;
   a rail that is attachable to a side of the base chassis to further secure attachment of the extension portion to the front portion, the rail including spools; and
   the front side portion and the extension portion defining closed circular apertures that are configured to receive respective ones of the spools of the rail to fixedly attach the rail to the front side portion and an extension side portion of the extension portion to secure the front side portion in a fixed relative position with respect to the extension portion.

9. The system of claim 8, wherein the front portion includes spools over which apertures defined by the first storage cage fit to removably attach the first storage cage.

10. The system of claim 8, wherein the front portion includes spools over which apertures defined by the first end of the extension portion fit to fixedly attach the extension portion to the front portion.

11. The system of claim 8, wherein the second end of the extension portion includes spools over which apertures defined by the first storage cage fit to attach the first storage cage.

12. The system of claim 8, further comprising an additional rail that is attachable to an opposite side of the base chassis to secure attachment of the extension portion to the front portion.

13. A method comprising:
providing a front portion, of a base chassis, to support at least a first storage cage that is removably attached to the front portion;
detaching the first storage cage from the front portion;
providing an extension portion, of the base chassis, including a first end and a second end;
fixedly attaching the first end of the extension portion to the front portion of the base chassis, the extension portion to extend a length of the base chassis to support an additional storage cage;
attaching the additional storage cage within the extension portion;

attaching the first storage cage to the second end of the extension portion to support the first storage cage such that the additional storage cage and the first storage cage together represent members of a set of linearly aligned storage cages for an extended base chassis; and attaching a rail, which includes one or more spools, to at least one side of the extended base chassis to fixedly attach the extension portion to the front portion, the rail to act as a guide when the extended base chassis is being inserted into or removed from a rack of a computing system, wherein the at least one side of the base chassis defines at least one closed circular aperture that is configured to receive a respective one of the one or more spools of the rail such that a relative position of the extension portion is fixed with respect to the front portion.

14. The method of claim 13, wherein detaching the first storage cage includes sliding the first storage cage to release apertures defined by the first storage cage from spools on the front portion over which the apertures fit.

15. The method of claim 13, wherein fixedly attaching the first end of the extension portion includes sliding the extension portion toward the front portion such that apertures defined by the extension portion fit over spools on the front portion.

16. The method of claim 13, wherein attaching the first storage cage to the second end of the extension portion includes sliding the first storage cage toward the second end of the extension portion such that apertures defined by the first storage cage fit over spools on the second end.

\* \* \* \* \*